United States Patent [19]
Sali et al.

[11] Patent Number: 5,784,314
[45] Date of Patent: Jul. 21, 1998

[54] METHOD FOR SETTING THE THRESHOLD VOLTAGE OF A REFERENCE MEMORY CELL

[75] Inventors: Mauro Sali, S. Angelo Lodigiano; Marco Dallabora, Carpiano; Marcello Carrera, Trescore Balneario, all of Italy

[73] Assignee: SGS-Thomson Microelectronics S.r.l., Agrate Brianza, Italy

[21] Appl. No.: 679,656

[22] Filed: Jul. 12, 1996

[30] Foreign Application Priority Data

Jul. 14, 1995 [EP] European Pat. Off. ............ 95830302

[51] Int. Cl.⁶ .................................................. G11C 11/34
[52] U.S. Cl. ........................... 365/185.2; 365/185.24
[58] Field of Search ........................ 365/185.2, 185.24, 365/210, 218

[56] References Cited

U.S. PATENT DOCUMENTS

| | | | |
|---|---|---|---|
| 5,077,691 | 12/1991 | Haddad et al. | 365/218 |
| 5,386,388 | 1/1995 | Atwood et al. | 365/189.09 |
| 5,444,656 | 8/1995 | Bauer et al. | 365/185.24 |
| 5,481,494 | 1/1996 | Tang et al. | 365/185.24 |

FOREIGN PATENT DOCUMENTS 7030000 1/1995 Japan.
WO 90/12400 10/1990 WIPO.

*Primary Examiner*—Joseph A. Popek
*Assistant Examiner*—Michael T. Tran
*Attorney, Agent, or Firm*—David V. Carlson; Bryan A. Santarelli; Seed and Berry LLP

[57] ABSTRACT

A method for setting the threshold voltage of a reference memory cell of a memory device is described, the reference memory cell being used as a reference current generator for generating a reference current which is compared by a sensing circuit of the memory device with currents sunk by memory cells to be sensed, belonging to a memory matrix of the memory device. The method comprises a first step in which the reference memory cell is submitted to a change in its threshold voltage, and a second step in which the threshold voltage of the reference memory cell is verified. The second step provides for performing a sensing of the reference memory cell using a memory cell with known threshold voltage belonging to the memory matrix as a reference current generator for generating a current which is compared by the sensing circuit with the current sunk by the reference memory cell.

11 Claims, 2 Drawing Sheets

METHOD FOR SETTING THE THRESHOLD VOLTAGE OF A REFERENCE MEMORY CELL

TECHNICAL FIELD

The present invention relates to a method for setting the threshold voltage of a reference memory cell in a nonvolatile memory device.

BACKGROUND OF THE INVENTION

In the field of semiconductor memories, a common technique for sensing the information stored in a given memory cell provides for biasing the memory cell in a predefined condition and comparing the current sunk by the memory cell with a reference current.

The reference current is normally generated by a reference memory cell, i.e., a memory cell programmed in a predefined condition such that, when it is biased, it sinks a predefined current.

Conventionally, some of the memory cells in the memory matrix of the memory device are used as reference memory cells. More particularly, inside the memory matrix, wherein the memory cells are arranged in columns (bit lines), one or more columns of memory cells are used as reference memory cell columns. The reference memory cells are thus immersed in the memory matrix together with the memory cells.

This solution has the advantage that differences in the geometrical and electrical characteristics between the memory cells and the reference memory cells are minimized, because a reference memory cell whose current is to be compared with the current of a memory cell to be sensed can be topologically near the memory cell to be sensed.

The previous arrangement is typically suitable, for example, for ROMs, EPROMs and EEPROMS. The previous arrangement, however, is often not suitable for Flash EEPROMs.

If in a Flash EEPROM the reference memory cells (represented by floating-gate MOS transistors) are immersed in the memory matrix, since the electrical erasure is a bulk operation involving all of the memory cells in the memory matrix (or at least sector of it), each time the memory cells in the memory matrix are electrically erased, the reference memory cells would be erased too, so that not only their programming condition would change, but also they would soon become depletion-mode transistors.

For these reasons, in Flash EEPROMs the reference memory cells are not immersed in the memory matrix, but are topologically external to it.

When the reference memory cells are external to the memory matrix, it is necessary to set their threshold voltage to a predefined value. This operation is carried out during the in-factory testing of the memory device, and is generally comprised of a repetition of two phases. A first phase, called "soft-programming," provides for changing step by step the threshold voltage of a given reference memory cell, and a second phase, called "verify" and performed after each soft-programming step, provides for detecting the threshold voltage of the reference memory cell and comparing the detected value with a predefined desired value.

The conventional technique for performing the verify phase provides for exploiting a specific test mode of the memory device, called "Direct Memory Access" (DMA). In this particular mode of operation, the reference memory cell is connected directly to one of the external terminals of the memory device, so that it is possible to measure the current sunk by the reference memory cell when it is biased in a predefined condition. The measured current is then compared (externally to the memory device) with a predetermined current used as a reference.

The use of the DMA mode of operation of the memory device to verify the current threshold voltage of the reference memory cell after each soft-programming step causes the operation of setting the threshold voltage of the reference memory cells to be rather long. Since several reference memory cells are normally provided in a single memory device, the overall time required for testing the memory device is thus greatly increased.

SUMMARY OF THE INVENTION

In view of the state of the art disclosed, an object of the present invention is to provide a method for setting the threshold voltage of a reference memory cell which is faster than methods according to the prior art.

According to the present invention, such an object is achieved by means of a method for setting the threshold voltage of a reference memory cell of a memory device, said reference memory cell being used as a reference current generator for generating a reference current which is compared by a sensing circuit of the memory device with currents sunk by memory cells to be sensed, said memory cells belonging to a memory matrix of the memory device, the method comprising a first step in which the reference memory cell is submitted to a change in its threshold voltage, and a second step in which the threshold voltage of the reference memory cell is verified, characterized in that said second step provides for performing a sensing of the reference memory cell using a memory cell with known threshold voltage belonging to the memory matrix as a reference current generator for generating a current which is compared by the sensing circuit with the current sunk by the reference memory cell.

Differently from known methods, the method according to the present invention provides for verifying the threshold voltage of the reference memory cells by performing a sensing operation, which typically is the fastest operation of a memory device. Such a sensing operation is performed using as a reference current for the sensing circuit of the memory device the current sunk by a memory cell of the memory matrix. In this way, the time necessary for performing the testing of the memory device is greatly reduced. The memory cell chosen as a reference current generator for verifying the threshold voltage of the reference memory cell has a known threshold voltage, so that the current it sinks has a known value. This is made possible by the fact that normally, before testing, the memory device is exposed to Ultra-Violet (UV) light to erase all the memory cells, so that the threshold voltage of the matrix memory cells is known.

BRIEF DESCRIPTION OF THE DRAWINGS

These and other features of the present invention will be made more evident by the following detailed description of two particular embodiments, illustrated as nonlimiting examples in the annexed drawings.

FIG. 1 is a schematic diagram of a semiconductor memory device showing a memory cell in a memory matrix, a reference memory cell and a sensing circuit.

3

Figure 3:
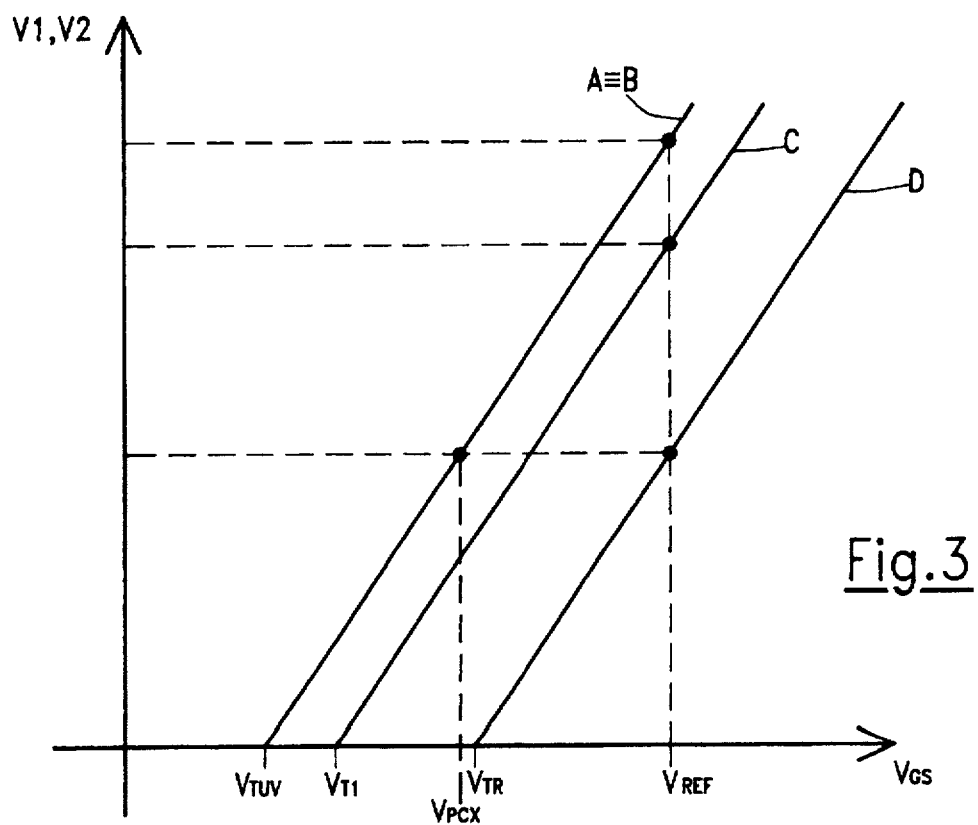

FIG. 3 is a diagram illustrating a second practical embodiment of the method of the invention.

Figures 1, 4:
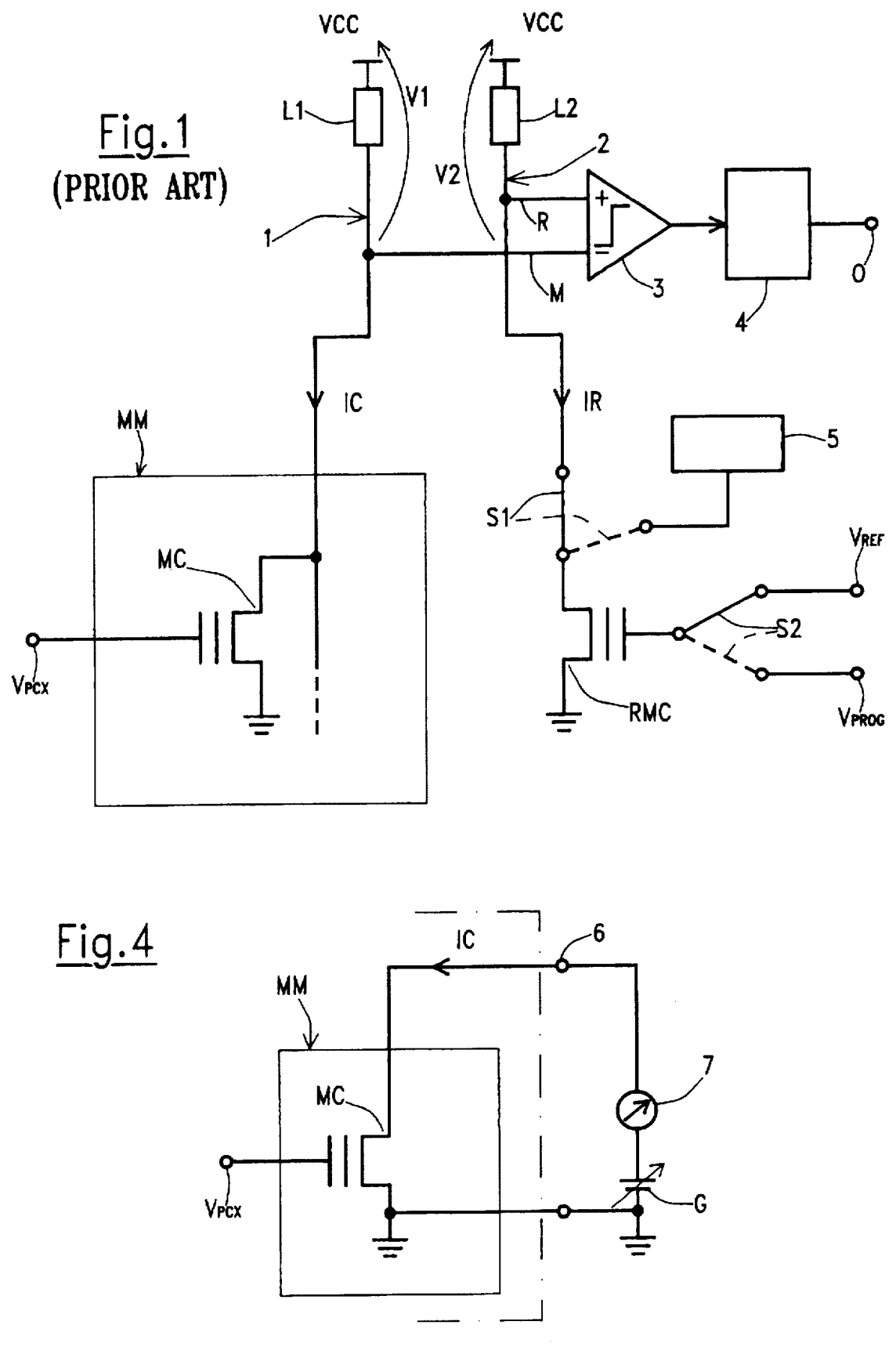

FIG. 4 is a schematic diagram of a circuit arrangement for performing a direct memory access (DMA) to the memory cell in the memory matrix.

DETAILED DESCRIPTION OF THE INVENTION

In FIG. 1, a conventional differential-mode sensing circuit of a memory device is schematically shown. The sensing circuit comprises a first branch 1, also called "matrix branch," including a memory cell MC (represented by a floating-gate MOS transistor) of a memory matrix MM and a first load impedance L1 with a first terminal connected to a voltage supply VCC, and a second branch 2, also called "reference branch," including a reference memory cell RMC (also represented by a floating-gate MOS transistor) and a second load impedance L2 with a first terminal connected to the voltage supply VCC. The second terminals of L1 and L2 are respectively connected to the inverting and noninverting inputs M and R of a comparator 3, whose output is supplied to a conventional output buffer circuit 4. The output of the output buffer circuit 4 forms an output data signal O of the memory device, and is typically supplied to an external terminal of the memory device.

In the reference branch 2, a switch S1 is schematically shown which selectively connects the reference memory cell RMC either to the noninverting input R of the comparator 3 or to a conventional program load circuit 5. A second switch S2 is also shown which selectively connects a control gate electrode of the reference memory cell RMC either to a read gate voltage $V_{REF}$ or to a programming gate voltage $V_{PROG}$.

In a normal reading of the memory device, the reference memory cell RMC provides a reference current IR which causes a voltage drop across L2. The voltage on the noninverting input R of the comparator 3 forms a reference voltage for the comparator 3. The memory cell MC to be read, biased in a predetermined condition, sinks a current IC, which causes a voltage drop across L1. If the current IC is lower than the reference current IR, the voltage drop across L1 is lower than that across L2, and the voltage on the input M of the comparator 3 is higher than the reference voltage. The memory cell MC is thus read as a programmed memory cell. If the current IC is higher than the reference current IR, the voltage drop across L1 is higher than the voltage drop across L2, so that the voltage on the input M is lower than the reference voltage. The memory cell MC is thus read as a nonprogrammed memory cell.

In the following, the method of the present invention will be explained by means of two practical examples.

Normally, at the end of the manufacturing process of a memory device, it is exposed to ultra-violet (UV) light, so that all the memory cells in the memory matrix MM, as well as the reference memory cells, are brought into a common programming condition, characterized by a threshold voltage $V_{TUV}$.

During the memory device testing, the threshold voltage of the reference memory cells is set to a predefined value (higher than $V_{TUV}$), such that during a normal reading operation, the reference memory cells are biased in a predefined condition such that they sink a predefined current IR.

To set the threshold voltage of the reference memory cells, they are submitted to short programming pulses. (Referring to FIG. 1, the switches S1 and S2 are switched in the positions represented by dotted lines, so that the reference memory cell RMC has the drain electrode connected to

4 the program load circuit 5 and the gate electrode connected to the programming voltage $V_{PROG}$.) After each programming pulse, a sensing operation of the reference memory cells is performed to verify if the threshold voltage of the reference memory cells has reached the desired value. If the threshold voltage of the reference memory cells is still lower than the desired value, another programming pulse is applied to them. When the threshold voltage of the reference memory cells reaches the desired value, the setting operation stops.

As a first example of practical implementation of the method of the present invention, it is supposed that the sensing circuit is of the so-called "unbalanced loads" type.

As known to one skilled in the field of semiconductor memories, in an unbalanced loads sensing circuit, the load impedance in the reference branch has a lower value than the load impedance in the branch containing the memory cell to be sensed.

Since according to the method of the invention, the current IC sunk by an UV-erased memory cell MC is used as a reference current for verifying the programming condition of the reference memory cell RMC, in the verify step of the programming condition of the reference memory cell RMC, the first branch 1 behaves as a reference branch, and the load impedance L1 must have a lower value than L2. In the following it is assumed that L2=k*L1, with k>1.

Figure 2:
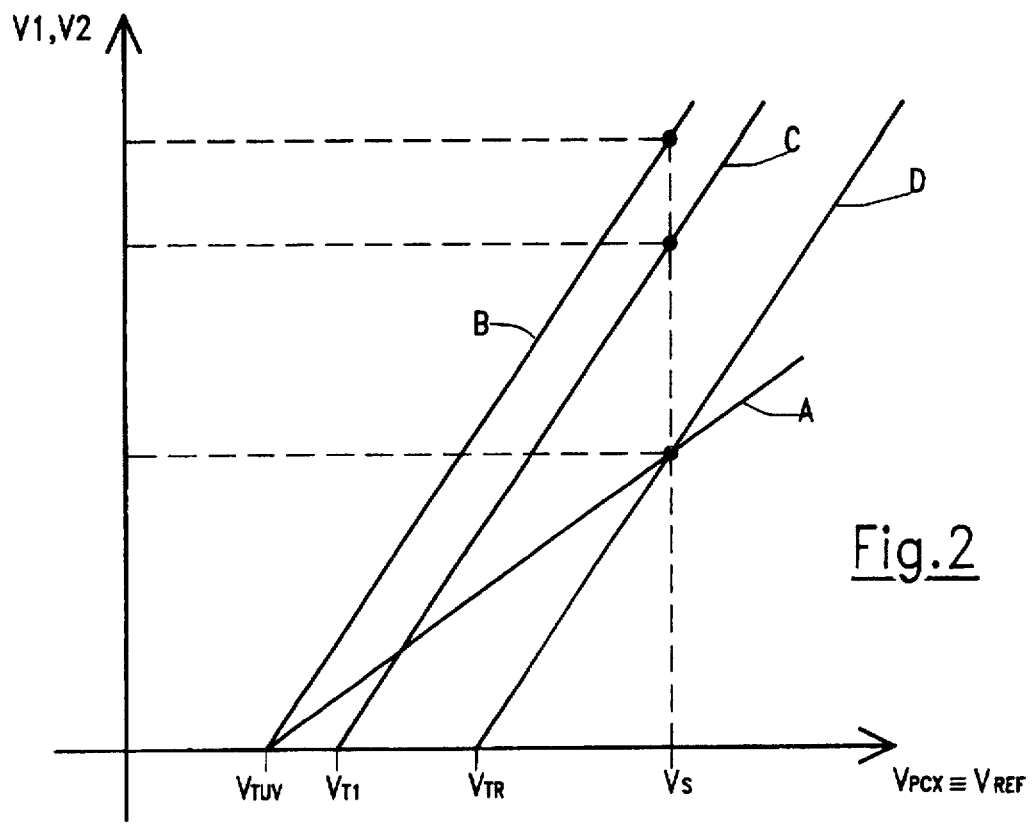
FIG. 2 is a diagram illustrating a first practical embodiment of the method of the invention.

In FIG. 2, line A represents the voltage drop V1 across L1 as a function of the voltage $V_{PCX}$ applied to the control gate electrode of the memory cell MC. As already mentioned, $V_{TUV}$ is the threshold voltage of the memory cell MC after exposure to UV light.

Similarly, lines B, C and D represent the voltage drop V2 across L2 as a function of the voltage $V_{REF}$ applied to the control gate of the reference memory cell RMC, assuming that $V_{REF}$ coincides with $V_{PCX}$, respectively after the exposure of the memory device to UV light, after a first programming pulse has been applied to the reference memory cell RMC, and at the end of the setting procedure. $V_{T1}$ is the threshold voltage value of RMC after the first programming pulse, and $V_{TR}$ is the desired threshold voltage value for the reference memory cell RMC. Line A has a slope which is k times lower than that of lines B, C and D.

As appears from FIG. 2, choosing to perform the sensing of the reference memory cell with a control gate voltage $V_{REF}=V_{PCX}=V_S$, where $V_S$ is the voltage corresponding to the intersection of line A with line D, as long as the threshold voltage of the reference memory cell RMC is lower than $V_{TR}$ the voltage drop V1 across L1 is lower than the voltage drop V2 across L2, and the output of the comparator 3 is at a low logic level. When the threshold voltage of the reference memory cell RMC reaches the desired value $V_{TR}$ the voltage drop V2 across L2 equals the voltage drop V1 across L1, and the output of the comparator 3 changes logic state. The value $V_S$ is given by:

$$V_S=(k/(k+1))*(V_{TR}-V_{TUV})+V_{TUV}$$

So, performing the sensing with the voltage $V_S$, when the output of the comparator 3 changes state it is possible to deduce that the threshold voltage of the reference memory cell RMC has reached the desired value $V_{TR}$, and the setting procedure can stop.

As a second example of practical implementation of the method of the invention, it is assumed that the control gate voltage $V_{REF}$ of the reference memory cell RMC is independent of the control gate voltage $V_{PCX}$ of the memory cell MC. Also, for the sake of simplicity, k is assumed to be equal to 1.

As appears from FIG. 3, in this case it is simply necessary to chose $V_{REF}$ so that:

$$V_{REF}=V_{PCX}+(V_{TR}-V_{TUV})$$

and to realize that as long as the output of the comparator 3 is in the low logic state, the threshold voltage of the reference memory cell RMC is lower than $V_{TR}$, while when the output of the comparator 3 changes logic state, the threshold voltage of the reference memory cell has reached the desired value $V_{TR}$, and the setting procedure can stop.

It is important to note that with the method of the present invention, the actual final programming condition of the reference memory cells depends on the current sunk by the memory cell MC chosen as a reference to perform the sensing of the reference memory cell, i.e., on the threshold voltage and on the geometrical characteristics of the memory cell MC.

For example, it should be taken into account the fact that in a memory device exposed to UV light, the statistical distribution of the threshold voltages of the memory cells has an amplitude of 400–600 mV.

It is thus preferable to perform a direct memory access to the memory cell MC to be used as a reference for sensing the reference memory cell RMC. In this way it is possible to determine its actual current-voltage characteristic, so that the statistical distribution of UV threshold voltage and of the geometrical characteristics of the memory cell can be taken into account. This direct memory access need be performed only once, before the setting procedure of the reference memory cells is started.

FIG. 4 schematically shows how such a direct memory access to the memory cell MC can be performed. The drain electrode of the memory cell MC is directly connected to an external terminal 6 of the memory device, and a variable voltage generator G is externally connected to the terminal 6. An ammeter 7 is connected in series between the voltage generator G and the external terminal 6 to measure the value of the memory cell current IC at different values of the voltage applied to the drain electrode of the memory cell MC.

Even taking into account this direct memory access to the memory cell MC, the present invention provides a fast method of setting the threshold voltages of the reference memory cells RMC.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for setting the threshold voltage of a reference memory cell that is internal to a memory device, the method comprising:
   adjusting said threshold voltage to a predetermined voltage;
   generating a test current with said reference memory cell;
   generating a reference current with a matrix memory cell that is internal to said memory device;
   comparing said test current with said reference current using a sensing circuit that is internal to said memory device;
   changing said threshold voltage of said reference cell by a predetermined amount; and
   repeating said generating a test current, said generating a reference current, said comparing, and said changing until said threshold voltage of said reference memory cell approximately equals a predetermined value.

2. The method of claim 1 wherein said repeating comprises repeating said generating a test current, said generating a reference current, said comparing, and said changing until said test current is approximately equal to a predetermined current.

3. The method of claim 1 wherein said repeating comprises repeating said generating a test current, said generating a reference current, said comparing, and said changing until said test current is approximately equal to said reference current.

4. The method of claim 1
   wherein said repeating comprises repeating said generating a test current, said generating a reference current, said comparing, and said changing until said test current generates across a first load a first voltage that is approximately equal to a second voltage that said reference current generates across a second load.

5. The method of claim 1, further comprising:
   coupling said matrix memory cell to a measuring device that is external to said memory device; and
   determining the current-voltage characteristic of said matrix memory cell using said measuring device.

6. A memory device, comprising:
   a reference-voltage terminal;
   a program-voltage terminal;
   a bias-voltage terminal;
   a supply terminal;
   a reference cell having a reference control terminal and a threshold, the reference cell for generating a reference current during a read cycle;
   a memory matrix that includes a matrix memory cell having a memory control terminal coupled to said bias-voltage terminal, the matrix memory cell operable to generate a reference current during a setting of said threshold of said reference cell;
   a first switch having a first switchable path coupled between said program-voltage terminal and said reference control terminal, said first switch having a second switchable path coupled between said reference-voltage terminal and said reference control terminal;
   a comparator circuit having a first input terminal coupled to said matrix memory cell, a second input terminal, and an output terminal;
   a first load coupled between said supply terminal and said first input terminal of said comparator circuit;
   a second load coupled between said supply terminal and said second input terminal of said comparator circuit;
   a program load circuit;
   a second switch having a first switchable path coupled between said second input terminal of said comparator circuit and said reference cell, said second switch having a second switchable path coupled between said program load circuit and said reference cell; and
   control means operable to control said first and second switches to cause said reference cell to generate a test current, to read a comparison signal from said comparator, to control said first and second switches to adjust said threshold of said reference cell by a predetermined amount, and to repeat said control, read, and control until said threshold of said reference cell approximately equals a predetermined value.

7. The memory device of claim 6, further comprising:

a terminal that is accessible external to the memory device;

a third switch having a first switchable path coupled between said first input terminal of said comparator and said matrix memory cell, said third switch having a second switchable path coupled between said terminal and said matrix memory cell and wherein said control means is operable to control said third switch and allow the determination of the threshold of the matrix memory cell by means external to the memory device.

8. Method for setting the threshold voltage of a reference memory cell of a memory device, said reference memory cell being used as a reference current generator for generating a reference current which is compared by a sensing circuit of the memory device with currents sunk by memory cells to be sensed, said memory cells belonging to a memory matrix of the memory device, the method comprising a first step in which the reference memory cell is submitted to a change in its threshold voltage, and a second step in which the threshold voltage of the reference memory cell is verified, characterized in that said second step provides for performing a sensing of the reference memory cell using a memory cell with known threshold voltage belonging to the memory matrix as a reference current generator for generating a current which is compared by the sensing circuit with the current sunk by the reference memory cell.

9. Method according to claim 8 characterized in that said first step and second step are repeated until the threshold voltage of the reference memory cell takes a predetermined value.

10. Method according to claim 9 characterized in that it comprises a preliminary step in which a direct memory access to said memory cell is performed to determine the threshold voltage thereof.

11. Method according to claim 9, characterized in that said memory cell is an UV-erased memory cell.

* * * * *